(12) United States Patent  
Okada et al.

(10) Patent No.: US 8,946,065 B2
(45) Date of Patent: Feb. 3, 2015

(54) METHOD OF FORMING SEED LAYER AND METHOD OF FORMING SILICON-CONTAINING THIN FILM

(71) Applicant: Tokyo Electron Limited, Tokyo (JP)

(72) Inventors: Mitsuhiro Okada, Nirasaki (JP); Akinobu Kakimoto, Nirasaki (JP); Kazuhide Hasebe, Nirasaki (JP)

(73) Assignee: Tokyo Electron Limited (JP)

( * ) Notice: Subject to any disclaimer, the term of this patent is extended or adjusted under 35 U.S.C. 154(b) by 77 days.

(21) Appl. No.: 13/661,153

(22) Filed: Oct. 26, 2012

(65) Prior Publication Data
US 2013/0109155 A1 May 2, 2013

(30) Foreign Application Priority Data

Oct. 28, 2011 (JP) ................................ 2011-237987

(51) Int. Cl.
| H01L 21/00 | (2006.01) |
| H01L 21/02 | (2006.01) |
| C23C 16/02 | (2006.01) |
| C23C 16/24 | (2006.01) |
| C30B 29/06 | (2006.01) |
| C30B 25/18 | (2006.01) |

(52) U.S. Cl.
CPC ........ *H01L 21/0245* (2013.01); *C23C 16/0272* (2013.01); *C23C 16/24* (2013.01); *C30B 29/06* (2013.01); *H01L 21/02532* (2013.01); *H01L 21/02573* (2013.01); *H01L 21/0262* (2013.01); *C30B 25/183* (2013.01)

USPC .......................................... 438/482; 438/478

(58) Field of Classification Search
CPC ..................... H01L 21/0245; H01L 21/02532
USPC ...................................... 438/478, 482
See application file for complete search history.

(56) References Cited

U.S. PATENT DOCUMENTS

2011/0312192 A1* 12/2011 Murakami et al. ............ 438/787
2013/0084693 A1* 4/2013 Kakimoto et al. ............ 438/482

FOREIGN PATENT DOCUMENTS

| JP | 07086173 | 3/1995 |
| JP | 2011249764 | 12/2011 |
| JP | 2012004542 | 1/2012 |
| JP | 2012049509 | 3/2012 |

* cited by examiner

Primary Examiner — Bradley K Smith
(74) Attorney, Agent, or Firm — Cantor Colburn LLP

(57) ABSTRACT

Provided is a method of forming a seed layer for forming a thin film, which is capable of further improving a thickness uniformity of the thin film. The method of forming a seed layer that is a seed of the thin film on a base includes adsorbing at least silicon included in an aminosilane-based gas on the base, by using the aminosilane-based gas; and depositing at least silicon included in a higher-order silane-based gas having an order that is equal to or higher than disilane on the base, on which at least the silicon included in the aminosilane-based gas is adsorbed, by using the higher-order silane-based gas having an order that is equal to or higher than the disilane.

21 Claims, 12 Drawing Sheets

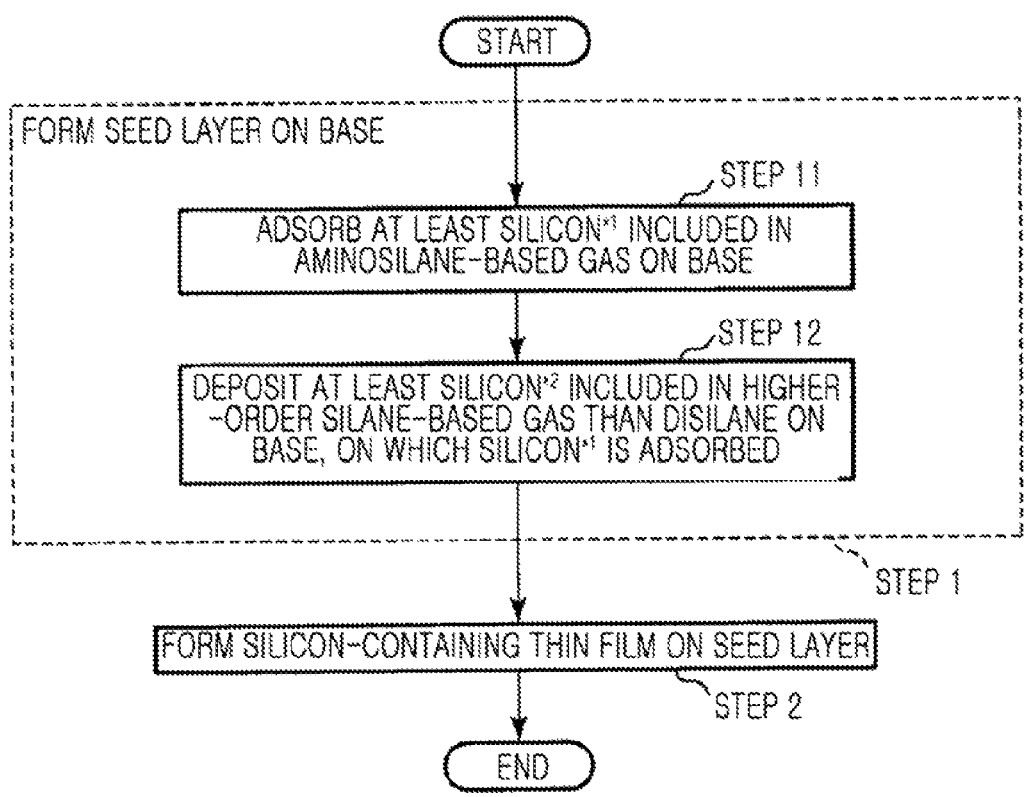

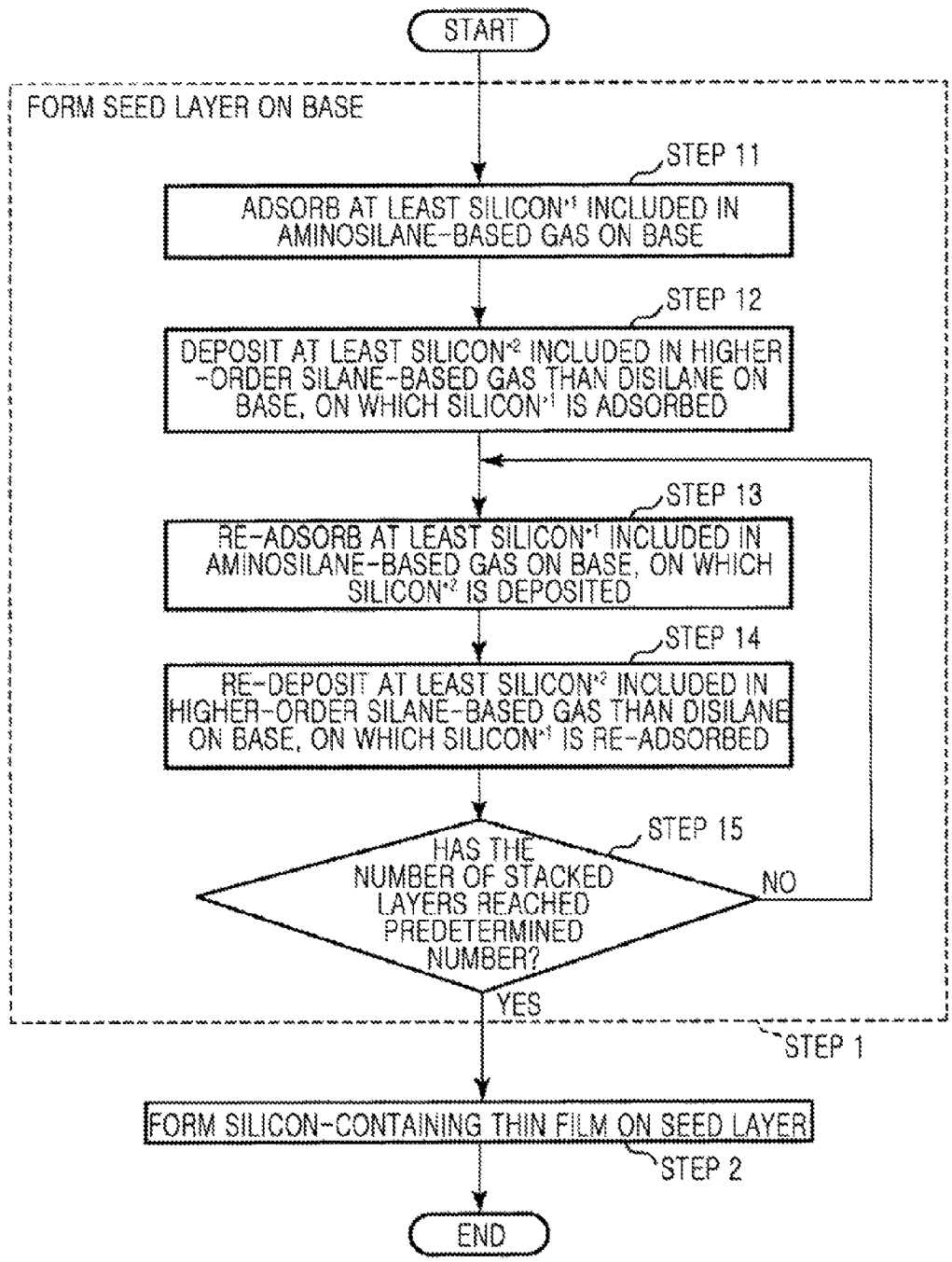

METHOD OF FORMING SEED LAYER AND METHOD OF FORMING SILICON-CONTAINING THIN FILM

CROSS-REFERENCE TO RELATED PATENT APPLICATIONS

This application claims the benefit of Japanese Patent Application No. 2011-237987, filed on Oct. 28, 2011, in the Japanese Patent Office, the disclosure of which is incorporated herein in its entirety by reference.

BACKGROUND OF THE INVENTION

1. Field of the Invention

The present invention relates to a method of forming a seed layer and a method of forming a silicon-containing thin film.

2. Description of the Related Art

Recently, semiconductor integrated circuit devices have been miniaturized. Due to the miniaturization, various thin films used in a semiconductor integrated circuit device are required to be much thinner and to have much higher film quality.

For example, Patent Reference 1 discloses a film forming method for forming an amorphous silicon film by using a disilane gas.

One of the indexes for evaluating "quality of a film" is a uniformity of a film thickness within a wafer surface (thickness uniformity).

In Patent Reference 1, when forming an amorphous silicon film, a film forming temperature is set to be 530° C. or lower, and a flow rate of the disilane gas is set as 300 cc or higher per minute. Accordingly, an amorphous silicon film having excellent thickness uniformity is obtained.

For example, in Patent Reference 1, the flow rate of the disilane gas ranges from 1000 cc to 2000 cc, and the film forming temperature ranges from 450° C. to 475° C., and accordingly, the amorphous silicon film having the thickness uniformity of about ±3.0 to 7.0%, which is very excellent, has been obtained.

However, as miniaturization of the semiconductor integrated circuit devices has further proceeded, a thickness uniformity of the thin film needs to be further improved.

3. Prior Art Reference (Patent Reference 1) Japanese Laid-open Patent Publication No. hei 7-86173

SUMMARY OF THE INVENTION

The present invention provides a method of forming a seed layer for forming a thin film and a method of forming a silicon-containing thin film using the seed layer, which are capable of improving a thickness uniformity of a thin film.

According to an aspect of the present invention, there is provided a method of forming a seed layer that is a seed of a thin film on a base, the method including: adsorbing at least silicon included in an aminosilane-based gas on the base, by using the aminosilane-based gas; and depositing at least silicon included in a higher-order silane-based gas having an order that is equal to or higher than disilane on the base, on which at least the silicon included in the aminosilane-based gas is adsorbed, by using the higher-order silane-based gas having an order that is equal to or higher than the disilane.

According to another aspect of the present invention, there is provided a method of forming a seed layer that is a seed of a thin film on a base, the method including: adsorbing at least silicon included in an aminosilane-based gas on the base; filling sites, where at least the silicon included in the aminosilane-based gas is not adsorbed, with at least silicon included in a higher-order silane-based gas having an order that is equal to or higher than disilane; and forming the seed layer by depositing at least the silicon included in the higher-order silane-based gas having an order that is equal to or higher than the disilane, by using both of the aminosilane-based gas and the higher-order silane-based gas having an order that is equal to or higher than the disilane.

According to another aspect of the present invention, there is provided a method of forming a silicon-containing thin film, the method including: forming a seed layer on a base; and forming the silicon-containing thin film on the seed layer, wherein the forming of a seed layer may be performed by using the method of forming a seed layer according to one of the above methods.

Additional object and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a flowchart describing an example of a method of forming a seed layer and a method of forming a silicon-containing thin film, according to an embodiment of the present invention;

FIG. 4 is a flowchart describing a method of forming a seed layer and a method of forming a silicon-containing thin film, according to a second embodiment of the present invention;

DETAILED DESCRIPTION OF THE INVENTION

Figure 2A:
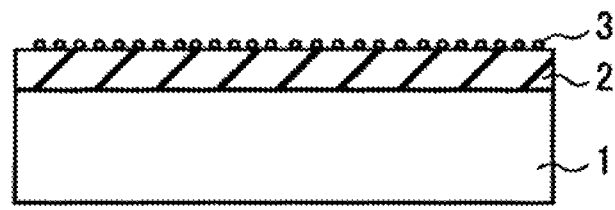
FIGS. 2A through 2C are cross-sectional views showing principal processes of the method of forming a seed layer and the method of forming a silicon-containing thin film, according to the first embodiment of the present invention.

An embodiment of the present invention achieved on the basis of the findings given above will now be described with reference to the accompanying drawings. In the following description, the constitute elements having substantially the same function and arrangement are denoted by the same reference numerals, and a repetitive description will be made only when necessary.

Hereinafter, the present invention will be described in detail by explaining exemplary embodiments of the invention with reference to the attached drawings. Like reference numerals in the drawings denote like elements.

(First Embodiment)

Figure 2B:
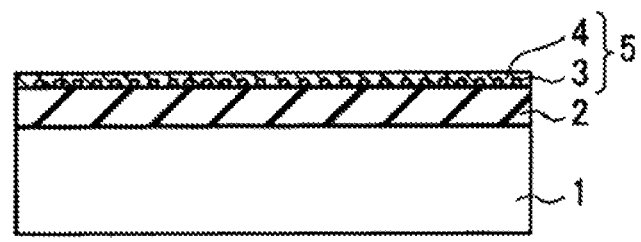
Figure 2C:
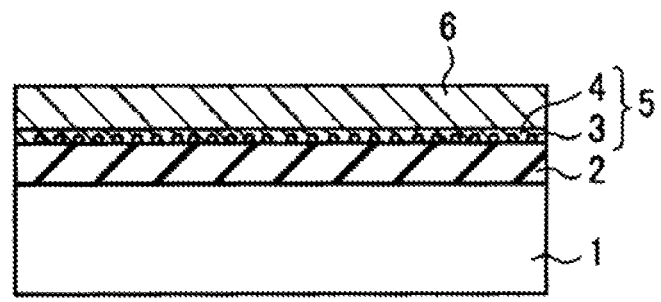

FIG. 1 is a flowchart describing an example of a method of forming a seed layer and a method of forming a silicon-containing thin film, according to a first embodiment of the present invention, and FIGS. 2A through 2C are cross-sectional views showing principal processes of the method of forming a seed layer and the method of forming a silicon-containing thin film according to the first embodiment.

As shown in step 1 of FIG. 1, a seed layer is formed on a base, in the present embodiment, on a silicon oxide ($SiO_2$) film formed on a silicon substrate (silicon wafer=silicon single crystalline). An example of the method of forming a seed layer according to the first embodiment is as follows.

As shown in step 11 of FIG. 1 and in FIG. 2A, by using an aminosilane-based gas, at least silicon[*1] included in the aminosilane-based gas is adsorbed to a silicon oxide film 2 formed on a silicon substrate 1. In more detail, the silicon substrate 1 is heated, and the aminosilane-based gas flows onto a main surface of the silicon oxide film 2 as a raw material gas for forming a first seed layer. Accordingly, a component including at least silicon, which is included in the aminosilane-based gas, is adsorbed to the main surface of the silicon oxide film 2, and a first seed layer 3 adsorbed at an atomic layer level, for example, a layer level of atoms (monatomic layer order), is formed. The first seed layer 3 is a very thin layer. FIG. 2A shows the first seed layer 3, in which silicon atoms are adsorbed as grains. The first seed layer 3 may be formed by, for example, an atomic layer deposition (ALD) method, in which a material of a thin film is stacked by a monatomic layer order.

An example of the aminosilane-based gas may be a gas including at least one of:

BAS (butylamino silane);
BTBAS (Bis(tertiary-butylamino)silane);
DMAS (dimethylaminosilane);
BDMAS (bis(dimethyl aminosilane));
TDMAS (tris(dimethylamino)silane);
DEAS (diethyl aminosilane);
BDEAS (bis(diethyl aminosilane));
DPAS (dipropyl aminosilane); and
DIPAS (diisopropyl aminosilane). In the present embodiment, DIPAS is used.

Examples of process conditions when forming the first seed layer 3 are as follows:

DIPAS flow: 200 sccm
Processing time: 1 min
Processing temperature: 400° C.
Processing pressure: 133.3 Pa (1 Torr).

Next, as shown in step 12 of FIG. 1 and FIG. 2B, by using a silane-based gas having an order higher than disilane, at least silicon included in the higher-order silane-based gas having an order equal to or higher than disilane is deposited on the silicon oxide film 2, on which the at least silicon[*1] included in the aminosilane-based gas is adsorbed, that is, the first seed layer 3 is formed. In more detail, the silicon substrate 1 is heated, and the higher-order silane-based gas, that is, having an order that is equal to or higher than disilane, is flown on the main surface of the silicon substrate 1, on which the first seed layer 3 is formed, as a raw material gas for forming a second seed layer. Accordingly, at least silicon[*2] included in the silane-based gas having an order that is equal to or higher than disilane is deposited on the first seed layer 3, thereby forming a second seed layer 4. The second seed layer 4 may be formed on the first seed layer 3 while, for example, filling between grains of the first seed layer 3, in a case where the first seed layer 3 is configured to include the grains. The second seed layer 4 may be formed by using, for example, a chemical vapor deposition (CVD) method, in which a raw material of the thin film is deposited by a CVD reaction.

An example of the higher-order silane-based gas having an order that is equal to or higher than disilane may include at least one of:

$Si_2H_6$,
a silicon hydride expressed as $Si_mH_{2m+2}$, where m is a natural number that is greater than or equal to 3, and
a silicon hydride expressed as $Si_nH_{2n}$, where n is a natural number that is greater than or equal to 3.

It is preferable that the silicon hydride expressed as $Si_mH_{2m+2}$, where m is a natural number that is greater than or equal to 3, is selected from at least one of:

trisilane ($Si_3H_8$);
tetrasilane ($Si_4H_{10}$);
pentasilane ($Si_5H_{12}$);
hexasilane ($Si_6H_{14}$); and
heptasilane ($Si_7H_{16}$).

Also, it is preferable that the silicon hydride expressed as $Si_nH_{2n}$, where n is a natural number that is greater than or equal to 3, is selected from at least one of:

cyclotrisilane ($Si_3H_6$);
cyclotetrasilane ($Si_4H_8$);
cyclopentasilane ($Si_5H_{10}$);
cyclohexasilane ($Si_6H_{12}$); and
cycloheptasilane ($Si_7H_{14}$).

In the present embodiment, disilane is used as the higher-order silane-based gas having an order that is equal to or higher than disilane.

Examples of processing conditions when forming the second seed layer 4 are:

Disilane flow: 200 sccm
Processing time: 4.3 min
Processing temperature: 400° C.
Processing pressure: 133.3 Pa (1 Torr).

As described above, according to the present embodiment, a dual seed layer 5, including the first seed layer 3 and the second seed layer 4 formed on the first seed layer 3, is formed. The dual seed layer 5 is in, for example, an amorphous state.

A main film of the thin film is formed on the dual seed layer 5. Thus, a thickness of the dual seed layer 5 may be, for example, greater than 0 nm and equal to or less than 2 nm, in consideration of a film thickness including the thickness of the dual seed layer 5 and a thickness of the main film of the thin film.

Also, the second seed layer 4 in the dual seed layer 5 may be doped with a dopant. When the second seed layer 4 is doped with the dopant, in the process shown in step 12 of FIG. 1 and FIG. 2B, a gas containing the dopant may be supplied with the higher-order silane-based gas having an order that is equal to or higher than disilane.

Examples of the dopant may be:

boron (B);
phosphor (P);
arsenic (As);
oxygen (O);
carbon (C); and
nitrogen (N).

The above dopants may be mixed. That is, the gas including at least one dopant selected from the above six kinds of dopants may be supplied with the higher-order silane-based gas having an order that is equal to or higher than disilane to form the second seed layer 4. In this case, at least the silicon included in the higher-order silane-based gas having an order that is equal to or higher than disilane is deposited on the silicon substrate 1, on which at least the silicon included in the aminosilane-based gas is adsorbed, wherein the silicon included in the higher-order silane-based gas having an order that is equal to or higher than disilane contains at least one of the above six kinds of dopants.

Next, as shown in step 2 of FIG. 1 and FIG. 2C, a silicon-containing thin film 6 is formed on the silicon substrate 1, on which the dual seed layer 5 is formed, as the main film of the thin film.

An example of the silicon-containing thin film 6 may be a silicon (Si) film or a silicon germanium (SiGe) film. The silicon-containing thin film 6 may be formed as follows.

(Example of Si Film)

In a case where the silicon-containing thin film 6 is the silicon film, a lower-order silane-based gas having an order that is lower than the above higher-order silane-based gas having an order that is equal to or higher than disilane is used as a raw material gas for forming the silicon film. For example, if a disilane gas is used to form the second seed layer 4, a monosilane gas may be used as the raw material gas for forming the silicon film.

Examples of processing conditions when the silicon-containing thin film 6 is the silicon film and the monosilane gas is used as the raw material gas are:

Monosilane flow: 200 sccm
Processing time: 3.8 min Processing temperature: 490° C.
Processing pressure: 53.3 Pa (0.4 Torr). Under the above processing conditions, a silicon film having a thickness of about 3 nm is formed as the main film of the thin film.

(Example of Silicon Germanium Film)

In a case where the silicon-containing thin film 6 is the silicon germanium film, a lower-order silane-based gas having an order that is lower than the higher-order silane-based gas having an order that is equal to or higher than disilane and a monogermane ($GeH_4$) gas are used as a raw material gas of the silicon germanium film. For example, if the disilane gas is used to form the second seed layer 4, a monosilane gas and the monogermane gas may be used as the raw material gas of the silicon germanium film.

Examples of processing conditions when the silicon-containing thin film 6 is the silicon germanium film and the monosilane gas and the monogermane gas are used as the raw material gas are:

Monosilane flow: 1200 sccm
Monogermane flow: 500 sccm
Processing time: 5 min
Processing temperature: 400° C.
Processing pressure: 533 Pa (4 Torr). Under the above processing conditions, a silicon germanium film having a thickness of about 4 nm is formed as the main film of the thin film.

As such, in the present embodiment, the silicon-containing thin film 6 which is composed of the silicon film or the silicon germanium film is formed on the dual seed layer 5.

The silicon-containing thin film 6 may be in one of:
an amorphous state;
a mixed state of an amorphous state and a nanocrystalline state;
a nanocrystalline state; and
a polycrystalline state after the film formation.

The state of the silicon-containing thin film 6 after the film formation may be determined during the forming of the silicon-containing thin film 6, or according to a process after the formation of the silicon-containing thin film 6. For example, if the state is determined during the formation of the silicon-containing thin film 6, the processing temperature, the processing pressure, and the flow of the raw material gas may be adjusted. In addition, if the state is determined after the formation of the silicon-containing thin film 6, the silicon substrate 1 on which the silicon-containing thin film 6 is formed may be annealed. The state of the silicon-containing thin film 6 may be controlled to one of the above four states by adjusting a processing temperature, a processing pressure, and a processing time of the annealing.

The silicon-containing thin film 6 is a main film of the thin film. Thus, the thickness of the thin film to be formed is almost dependent upon the thickness of the silicon-containing thin film 6. The thickness of the silicon-containing thin film 6 is determined according to demands of a user. However, in consideration of practical use, the thickness of the silicon-containing thin film 6 may be greater than 0 nm and equal to or less than 100 nm.

Also, like the second seed layer 4, the silicon-containing thin film 6 may be doped with a dopant.

Examples of the dopant may be:
boron (B);
phosphor (P);
arsenic (As);
oxygen (O);
carbon (C); and
nitrogen (N). In addition, the above dopants may be mixed, like the dopant with which the second seed layer 4 is doped.

Also, the dopant may be doped during the formation of the silicon-containing thin film 6 or after the formation of the silicon-containing thin film 6. If the dopant is doped during the formation of the silicon-containing thin film 6, in the process shown in step 1 of FIG. 1 and FIG. 2C, a gas containing the dopant may be supplied with, for example, the raw material gas. If the dopant is doped after the formation of the silicon-containing thin film 6, the dopant may be diffused in the silicon-containing thin film 6 through a vapor deposition process.

According to the method of forming a seed layer and the method of forming a silicon-containing thin film of the first embodiment, the following advantages may be obtained.

Figure 3:
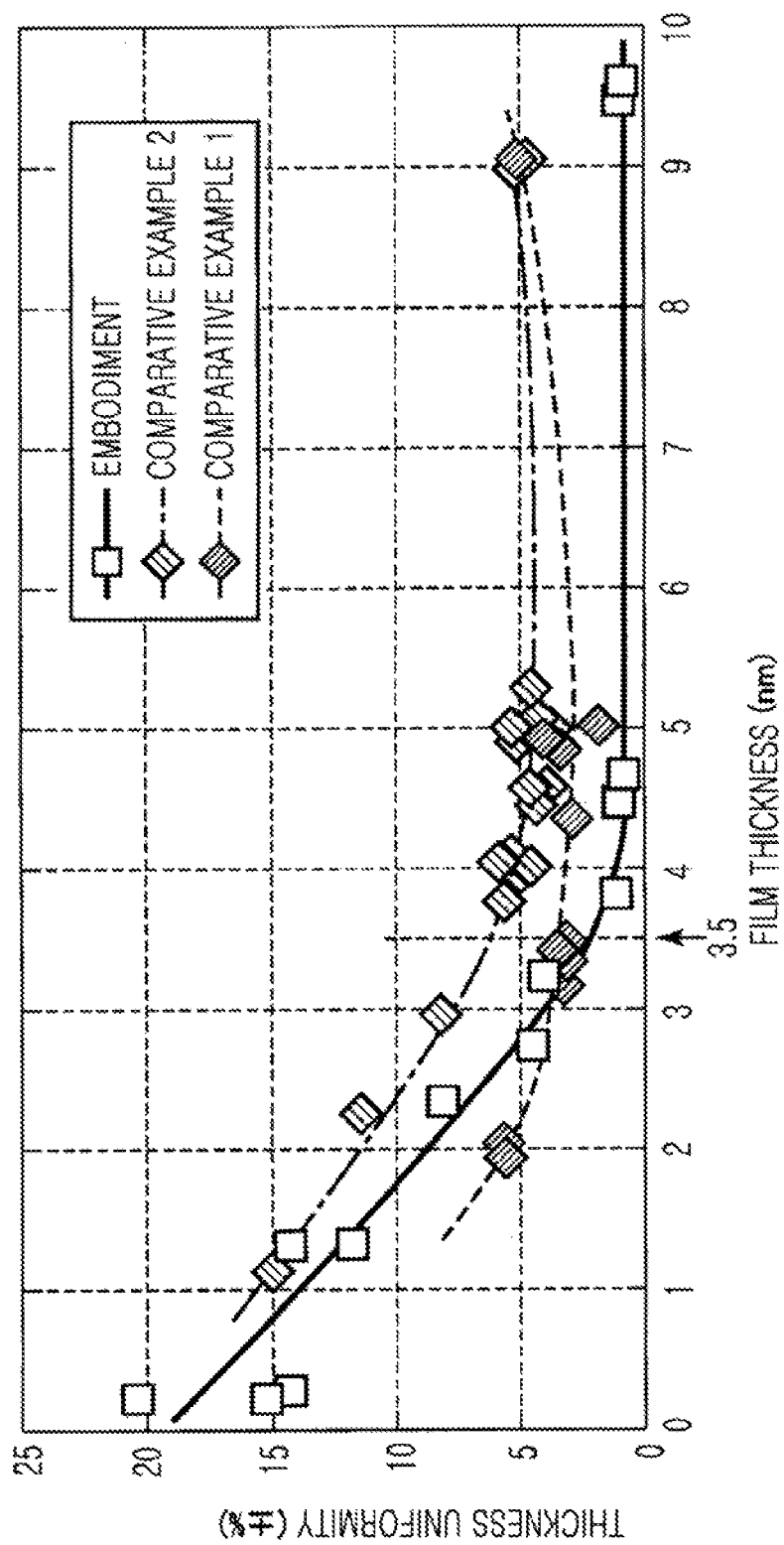
FIG. 3 is a graph showing film thickness versus thickness uniformity.

FIG. 3 is a graph showing a relationship between film thickness and thickness uniformity.

FIG. 3 shows a relationship between the film thickness and the thickness uniformity of the silicon-containing thin film 6 formed on the dual seed layer 5 by using the monosilane gas (the embodiment), a silicon-containing thin film formed on a single seed layer that is formed by using an aminosilane-based gas by using a disilane gas (comparative example 1), and a silicon-containing thin film formed on a base ($SiO_2$) by using a disilane gas without forming a seed layer (comparative example 2). Also, the film thickness is a sum of the thickness of the seed layer and the thickness of the silicon-containing thin film, in a case where there is a seed layer.

As shown in FIG. 3, according to comparative examples 1 and 2, the best thickness uniformity value is about ±2 to 4%. On the other hand, according to the embodiment of the present invention, the best thickness uniformity value is about ±1%. Moreover, an excellent thickness uniformity of about ±1% is also maintained when the film thickness is around 10 nm. That is, according to the embodiment of the present invention, the excellent thickness uniformity may be maintained even when the film thickness increases.

Also, in a case where the film thickness is thin, the thickness uniformity of the comparative example 1 is superior to that of the embodiment of the present invention when the thickness is less than 3.5 nm. Thus, in order to obtain the excellent thickness uniformity of about ±1% in the silicon-containing thin film 6 formed on the dual seed layer 5 by using the monosilane gas, the thickness may be 3.5 nm or greater.

Also, it does not mean that the silicon-containing thin film 6 (including the thickness of the dual seed layer 5) having a thickness less than 3.5 nm cannot be adopted. Even when the thickness uniformity is about ±4 to 15%, which satisfies the needs of a user, the silicon-containing thin film 6 having a thickness less than 3.5 nm may be used. Additionally, when the silicon-containing thin film 6 is formed to have a thickness of 3.5 nm or greater (including the thickness of the dual seed layer 5), the excellent thickness uniformity of about ±1% can be obtained.

As described above, according to the method of forming a seed layer and the method of forming a silicon-containing thin film of the first embodiment of the present invention, the seed layer is the dual seed layer 5, including the first seed layer 3 formed by using the aminosilane-based gas and the second seed layer 4 formed by using the higher-order silane-based gas having an order that is equal to or higher than disilane, and thus, the thickness uniformity of the thin film may be further improved.

(Second Embodiment)

Figure 5A:
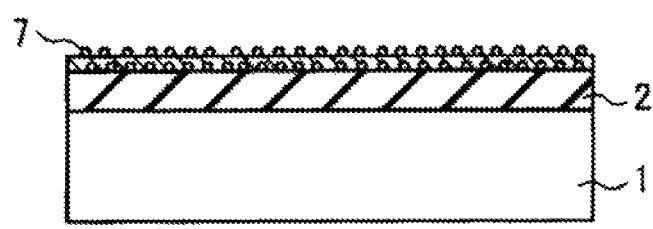
FIGS. 5A through 5C are cross-sectional views showing principal processes of the method of forming a seed layer and the method of forming a silicon-containing thin film, according to the second embodiment of the present invention.
Figure 5B:
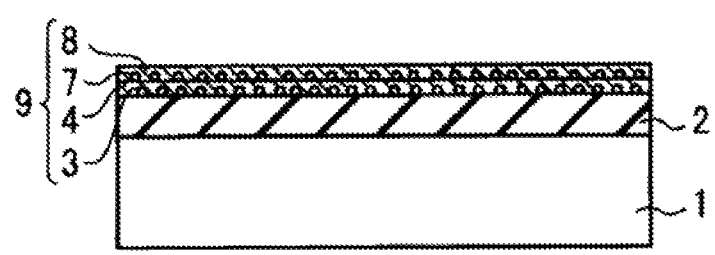
Figure 5C:
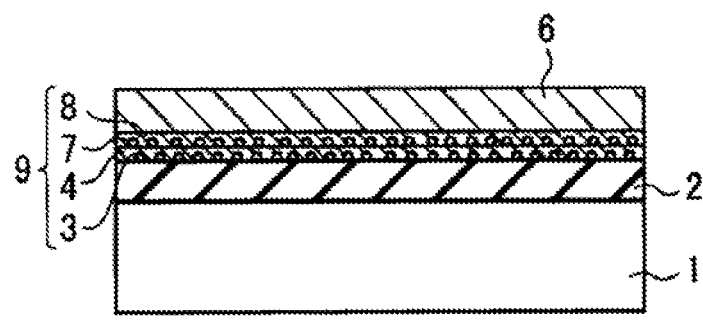

FIG. 4 is a flowchart describing an example of a method of forming a seed layer and a method of forming a silicon-containing thin film according to a second embodiment of the present invention, and FIGS. 5A through 5C are cross-sectional views showing principal processes of the method of forming a seed layer and the method of forming a silicon-containing thin film, according to the second embodiment.

The second embodiment is different from the first embodiment in that a multi-layered seed layer is formed by stacking a plurality of seed layers formed by using the aminosilane-based gas and seed layers formed by using the higher-order silane-based gas having an order that is equal to or higher than disilane, while the dual seed layer 5 is formed according to the first embodiment.

That is, as shown in step 13 of FIG. 4 and FIG. 5A, after performing the operation of step 12 described in the first embodiment, by using the aminosilane-based gas, a third seed layer 7 is formed by re-adsorbing at least the silicon[*1] included in the aminosilane-based gas on a base, on which at least the silicon[*2] included in the higher-order silane-based gas having an order that is equal to or higher than the disilane is deposited, that is, on the second seed layer 4. The third seed layer 7 may be formed by using, for example, an ALD method, like the first seed layer 3.

An example of the aminosilane-based gas used to form the third seed layer 7 is the same as the example of the aminosilane-based gas described in the above first embodiment. The aminosilane-based gas used to form the first seed layer 3 may be used to form the third seed layer 7, of course. In the present embodiment, DIPAS used to form the first seed layer 3 is used.

Examples of processing conditions when forming the third seed layer 7 are:

DIPAS flow: 200 sccm
Processing time: 10 sec
Processing temperature: 400° C.
Processing pressure: 133.3 Pa (1 Torr).

Next, as shown in step 14 of FIG. 4 and FIG. 5B, by using the higher-order silane-based gas having an order that is equal to or higher than the disilane, a fourth seed layer 8 is formed by re-depositing at least the silicon[*2] included in the higher-order silane-based gas having an order that is equal to or higher than the disilane on the base, on which at least the silicon[*1] included in the aminosilane-based gas is re-adsorbed, that is, on the third seed layer 7. The fourth seed layer 8 may be formed by using, for example, the CVD method, like the second seed layer 4.

An example of the higher-order silane-based gas having an order that is equal to or higher than disilane used to form the fourth seed layer 8 is the same as the example of the higher-order silane-based gas described in the above first embodiment. The higher-order silane-based gas having an order that is equal to or higher than the disilane used to form the second seed layer 4 may be used to form the fourth seed layer 8. In the present embodiment, the disilane used to form the second seed layer 4 is used.

Examples of processing conditions when forming the fourth seed layer 8 are:

Disilane flow: 200 sccm
Processing time: 1 min
Processing temperature: 400° C.
Processing pressure: 133.3 Pa (1 Torr).

Next, as shown in step 15 of FIG. 4, it is determined whether the number of stacked seed layers reaches a predetermined number. If the number of stacked seed layers has not reached the predetermined number (No), the process goes to step 13, and then, operations of step 13 and step 14 are repeatedly performed. If the number of stacked seed layers has reached the predetermined number (Yes), the process goes to step 2, and as shown in FIG. 5C, the silicon-containing thin film 6 is formed on the multi-layered seed layer 9 including at least four layers, that is, first through fourth seed layers 3, 4, 7, and 8. The silicon-containing thin film 6 may be formed by the same method as that described in the first embodiment.

As described above, the seed layer may be the multi-layered seed layer 9 including at least four layers, that is, first through fourth seed layers 3, 4, 7, and 8. If the seed layer is formed as the multi-layered seed layer 9, the same advantages as those of the first embodiment may be obtained.

Also, the third and fourth seed layers 7 and 8 may be modified like the first and second seed layers 3 and 4 described in the above first embodiment. For example, the fourth seed layer 8 like in the first embodiment may be doped with a dopant, and the multi-layered seed layer 9 may be in an amorphous state.

Likewise, the silicon-containing thin film 6 may be modified as described in the first embodiment.

(Third Embodiment)

Figure 6:
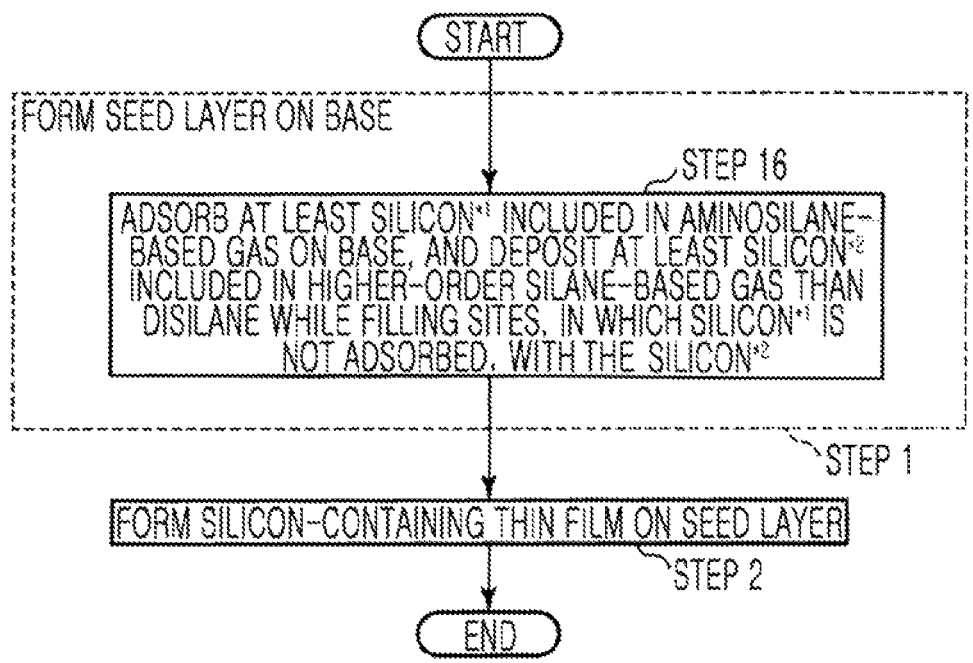
FIG. 6 is a flowchart describing a method of forming a seed layer and a method of forming a silicon-containing thin film, according to a third embodiment of the present invention.
Figure 7A:
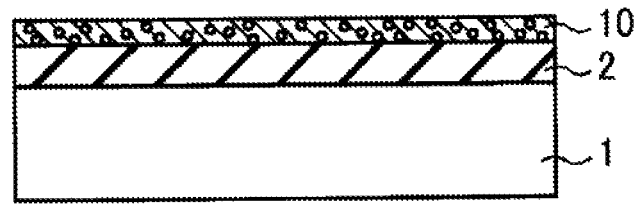
FIGS. 7A and 7B are cross-sectional views showing principal processes of the method of forming a seed layer and the method of forming a silicon-containing thin film, according to the third embodiment of the present invention.
Figure 7B:
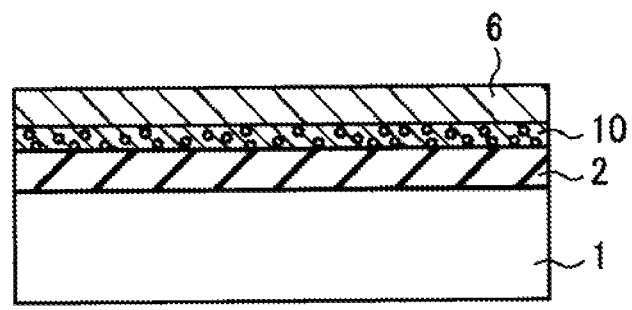

FIG. 6 is a flowchart describing an example of a method of forming a seed layer and a method of forming a silicon-containing thin film, according to a third embodiment of the present invention, and FIGS. 7A and 7B are cross-sectional views showing principal processes of the method of forming a seed layer and the method of forming a silicon-containing thin film, according to the third embodiment.

The third embodiment of the present invention is different from the first embodiment in that a mixed seed layer is formed by using both of an aminosilane-based gas and a higher-order silane-based gas having an order that is equal to or higher than disilane, while the dual seed layer 5 is formed in the first embodiment.

That is, as shown in step 16 of FIG. 6 and FIG. 7A, a mixed seed layer 10 is formed on a base, that is, on the silicon oxide film 2 in the present embodiment, by using the aminosilane-based gas and the higher-order silane-based gas having an order that is equal to or higher than disilane. The mixed seed layer 10 is formed by, for example, adsorbing at least the silicon[*1] included in the aminosilane-based gas on the base, that is, the silicon oxide film 2 in the present embodiment, and by filling sites, where the silicon[*1] is not adsorbed, with at least the silicon*2 included in the higher-order silane-based gas and depositing the silicon*2.

Examples of processing conditions when forming the mixed seed layer 10 are:
DIPAS flow: 200 sccm
Disilane flow: 200 sccm
Processing time: 15.4 min
Processing temperature: 400° C.
Processing pressure: 133.3 Pa (1 Torr).

Next, as shown in step 2 of FIG. 6 and FIG. 7B, the silicon-containing thin film 6 is formed on the mixed seed layer 10. The silicon-containing thin film 6 may be formed by the same method as that described in the first embodiment.

As described above, the seed layer may be the mixed seed layer 10 formed by using the aminosilane-based gas and the higher-order silane-based gas having an order that is equal to or higher than the disilane, for example, by flowing the gases at the same time. Even when the seed layer is the mixed seed layer 10, the same advantages as those of the first embodiment may be obtained.

Also, the silicon-containing thin film 6 may be modified as described in the first embodiment.

While this invention has been particularly shown and described with reference to exemplary embodiments thereof, it will be understood by those skilled in the art that various changes in form and details may be made therein without departing from the spirit and scope of the invention as defined by the appended claims.

For example, detailed examples of the processing conditions are described in the above embodiments; however, the processing conditions are not limited to the above examples.

Also, the silicon oxide film 2 is used as the base; however, the base is not limited to the silicon oxide film 2. For example, the base may be a silicon nitride film, a polycrystalline silicon film, or the silicon substrate 1. In addition, a metal film, including an internal wiring layer such as tungsten or copper, may be used as the base. Moreover, a dielectric film having a relative dielectric constant that is higher than that of a silicon oxide film, for example, a tantalum oxide film used as a dielectric film of a capacitor may be used as the base.

Also, the aminosilane-based gas is not limited to the gases above, molecular formulas of which include one Si, but may be a gas, a molecular formula of which includes two Si, for example, hexakisethylaminodisilane ($C_{12}H_{36}N_6Si_2$).

Also, besides the hexakisethylaminodisilane, materials expressed as the following formulas (1) through (4) may be used.

$$((R1R2)N)nSi_2H_6\text{-}n\text{-}m(R3)m \ldots n: \text{the number of amino groups, m: the number of alkyl groups} \quad (1)$$

$$((R1)NH)nSi_2H_6\text{-}n\text{-}m(R3)m \ldots n: \text{the number of amino groups, m: the number of alkyl groups} \quad (2)$$

In formulas (1) and (2),
R1, R2, R3=$CH_3$, $C_2H_5$, $C_3H_7$,
R1=R2=R3, or may not be the same as each other.
n=an integer ranging from 1 to 6
m=an integer of 0, and 1 to 5.

$$((R1R2)N)nSi_2H_6\text{-}n\text{-}m(Cl)m \ldots n: \text{the number of amino groups, m: the number of chlorine} \quad (3)$$

$$((R1)NH)nSi_2H_6\text{-}n\text{-}m(Cl)m \ldots n: \text{the number of amino groups, m: the number of chlorine} \quad (4)$$

where in formulas (3) and (4),
R1, R2=$CH_3$, $C_2H_5$, $C_3H_7$
R1=R2, or may not be the same as each other.
n=an integer ranging from 1 to 6
m=an integer of 0, and 1 to 5.

Otherwise, the present invention may be modified variously within a scope of the invention.

According to the present invention, the method of forming a seed layer for forming a thin film and the method of forming a silicon-containing thin film by using the seed layer, which are capable of further improving the thickness uniformity of the thin film, may be provided.

What is claimed is:

1. A method of forming a silicon-containing thin film, the method comprising:
    forming a first seed layer on a base by adsorbing at least silicon included in an aminosilane-based gas on the base, using the aminosilane-based gas;
    forming a second seed layer on the first seed layer by depositing at least silicon included in a higher-order silane-based gas having an order that is equal to or higher than disilane, using the higher-order silane-based gas having an order that is equal to or higher than the disilane, wherein the first seed layer and the second seed layer form a dual seed layer; and
    forming the silicon-containing thin film on the dual seed layer.

2. The method of claim 1, wherein the adsorption of the silicon in the forming of the first seed layer is performed by adsorbing silicon having a monatomic layer order by using an atomic layer deposition (ALD) method, and the deposition of the silicon in the forming of the second seed layer is performed by using a chemical vapor deposition (CVD) method that silicon is deposited due to CVD reaction.

3. The method of claim 1, after the forming of the second seed layer and before the forming of the silicon-containing thin film, further comprising:
    forming the third seed layer by re-adsorbing at least the silicon included in the aminosilane-based gas on the base, on which at least the silicon included in the higher-order silane-based gas having an order that is equal to or higher than the disilane is deposited, using the aminosilane-based gas; and
    forming the fourth seed layer by re-depositing at least the silicon included in the higher-order silane-based gas having an order that is equal to or higher than the disilane on the base, on which at least the silicon included in the aminosilane-based gas is re-adsorbed, using the higher-order silane-based gas having an order that is equal to or higher than the disilane,
    wherein the forming of the third seed layer and the forming of the fourth seed layer are performed once or more, and the first seed layer, the second seed layer, one or more third seed layers and one or more fourth seed layers form a multi-layered seed layer.

4. The method of claim 3, wherein in the forming of the third seed layer, the adsorption of the silicon is performed by adsorbing the silicon having the monatomic layer order using the atomic layer deposition (ALD) method, and in the forming of the fourth seed layer, the deposition of the silicon is performed by using the chemical vapor deposition (CVD) method that silicon is deposited due to CVD reaction.

5. The method of claim 3, wherein in the forming of the fourth seed layer, a gas including at least one dopant selected from boron (B), phosphor (P), arsenic (As), oxygen (O), carbon (C), and nitrogen (N) is supplied with the higher-order silane-based gas having an order that is equal to or higher than the disilane, and at least the silicon included in the higher-order silane-based gas having an order that is equal to or higher than the disilane is deposited on the base, on which at least the silicon included in the aminosilane-based gas is adsorbed, while including the dopant on the base.

6. The method of claim 1, wherein in the forming the second seed layer, a gas including at least one dopant selected from boron (B), phosphor (P), arsenic (As), oxygen (O), carbon (C), and nitrogen (N) is supplied with the higher-order silane-based gas having an order that is equal to or higher than the disilane, and at least the silicon included in the higher-order silane-based gas having an order that is equal to or higher than the disilane is deposited on the base, on which at least the silicon included in the aminosilane-based gas is adsorbed, while including the dopant on the base.

7. A method of forming a silicon-containing thin film, the method comprising:
    forming a mixed seed layer on a base, using both of an aminosilane-based gas and a higher-order silane-based gas having an order that is equal to or higher than the disilane, by
        adsorbing at least silicon included in the aminosilane-based gas on the base,
        filling sites, where at least the silicon included in the aminosilane-based gas is not adsorbed, with at least silicon included in the higher-order silane-based gas having an order that is equal to or higher than disilane, and
        depositing at least the silicon included in the higher-order silane-based gas having an order that is equal to or higher than the disilane on the base; and
    forming the silicon-containing thin film on the mixed seed layer.

8. The method of claim 1, wherein the aminosilane-based gas is selected from gases including at least one of:
    BAS (butylamino silane);
    BTBAS (Bis(tertiary-butylamino)silane);
    DMAS (dimethylaminosilane);
    BDMAS (bis(dimethyl aminosilane));
    TDMAS (tris(dimethylamino)silane);
    DEAS (diethyl aminosilane);
    BDEAS (bis(diethyl aminosilane));
    DPAS (dipropyl aminosilane);
    DIPAS (diisopropyl aminosilane);
    hexakisethylaminodisilane;
    (1) $((R1R2)N)nSi_2H_6\text{-}n\text{-}m(R3)m$;
    (2) $((R1)NH)nSi_2H_6\text{-}n\text{-}m(R3)m$;
    (3) $((R1R2)N)nSi_2H_6\text{-}n\text{-}m(C1)m$; and
    (4) $((R1)NH)nSi_2H_6\text{-}n\text{-}m(C1)m$,
    wherein, in formulas (1) and (2), n: the number of amino groups m: the number of alkyl groups, in formulas (3) and (4), n: the number of amino groups m: the number of chlorine, and in formulas (1) through (4), n=an integer ranging from 1 to 6, m=an integer of 0, and 1 to 5, R1, R2, R3=$CH_3$, $C_2H_5$, $C_3H_7$, and R1=R2=R3 or may not be the same.

9. The method of claim 1, wherein the higher-order silane-based gas having an order that is equal to or higher than the disilane is selected from gases including at least one of:
    $Si_2H_6$,
    a silicon hydride expressed as $Si_mH_{2m+2}$, wherein m is a natural number that is greater than or equal to 3, and
    a silicon hydride expressed as $Si_nH_{2n}$, wherein n is a natural number that is greater than or equal to 3.

10. The method of claim 9, wherein the silicon hydride expressed as $Si_mH_{2m+2}$, wherein m is a natural number that is greater than or equal to 3, is selected from at least one of:
    trisilane ($Si_3H_8$);
    tetrasilane ($Si_4H_{10}$);
    pentasilane ($Si_5H_{12}$);
    hexasilane ($Si_6H_{14}$); and
    heptasilane ($Si_7H_{16}$), and
    the silicon hydride expressed as $Si_nH_{2n}$, wherein n is a natural number that is greater than or equal to 3, is selected from at least one of:
    cyclotrisilane ($Si_3H_6$);
    cyclotetrasilane ($Si_4H_8$);
    cyclopentasilane ($Si_5H_{10}$);
    cyclohexasilane ($Si_6H_{12}$); and
    cycloheptasilane ($Si_7H_{14}$).

11. The method of claim 1, wherein a thickness of the seed layer is greater than 0 nm and equal to or less than 2 nm.

12. The method of claim 1, wherein the dual seed layer is an amorphous layer.

13. The method of claim 1, wherein when the silicon-containing thin film is a silicon film, a lower-order silane-based gas having an order that is lower than the higher-order silane-based gas having an order that is equal to or higher than the disilane is used as a raw material gas of the silicon film.

14. The method of claim 13, wherein if the higher-order silane-based gas having an order that is equal to or higher than the disilane is a disilane gas, a monosilane gas is used as the raw material gas of the silicon film.

15. The method of claim 1, wherein when the silicon-containing thin film is a silicon germanium film, a lower-order silane-based gas having an order that is lower than the higher-order silane-based gas having an order that is equal to or higher than disilane and a monogermane gas are used as raw material gases of the silicon germanium film.

16. The method of claim 15, wherein if the higher-order silane-based gas having an order that is equal to or higher than the disilane is a disilane gas, a monosilane gas and the monogermane gas are used as the raw material gases of the silicon germanium film.

17. The method of claim 1, wherein the silicon-containing thin film is doped with a dopant that is selected from boron (B), phosphor (P), arsenic (As), oxygen (O), carbon (C); and nitrogen (N).

18. The method of claim 17, wherein the dopant is doped during the forming of the silicon-containing thin film, or after forming the silicon-containing thin film.

19. The method of claim 1, wherein the silicon-containing thin film after the forming of the silicon-containing thin film is in one of an amorphous state, a mixed state of an amorphous state and a nanocrystalline state, a nanocrystalline state, and a polycrystalline state.

20. The method of claim 19, wherein the state of the silicon-containing thin film after the forming of the silicon-containing thin film is determined during the formation of the silicon-containing thin film, or determined according to a process performed after the formation of the silicon-containing thin film.

21. The method of claim 1, wherein a thickness of the silicon-containing thin film is greater than 0 nm and equal to or less than 100 nm.

* * * * *